US012643192B2

(12) United States Patent
Joeng et al.

(10) Patent No.: US 12,643,192 B2
(45) Date of Patent: Jun. 2, 2026

(54) POLISHING PAD, METHOD FOR MANUFACTURING THE SAME, AND METHOD FOR MANUFACTURING SEMICONDUCTOR DEVICE USING THE SAME

(71) Applicant: SK enpulse Co., Ltd., Gyeonggi-do (KR)

(72) Inventors: Eun Sun Joeng, Gyeonggi-do (KR); Jong Wook Yun, Seoul (KR); Jang Won Seo, Seoul (KR); Su Young Moon, Seoul (KR)

(73) Assignee: ENPULSE CO., LTD., Chungcheongnam-do (KR)

( * ) Notice: Subject to any disclaimer, the term of this patent is extended or adjusted under 35 U.S.C. 154(b) by 945 days.

(21) Appl. No.: 17/736,784

(22) Filed: May 4, 2022

(65) Prior Publication Data

US 2022/0355436 A1      Nov. 10, 2022

(30) Foreign Application Priority Data

May 7, 2021     (KR) ........................ 10-2021-0059382

(51) Int. Cl.
| | |
|---|---|
| *B24B 37/04* | (2012.01) |
| *B24B 37/24* | (2012.01) |
| *B24B 37/22* | (2012.01) |
| *B24B 37/26* | (2012.01) |
| *B24D 11/00* | (2006.01) |
| *B24D 18/00* | (2006.01) |
| *H10P 72/00* | (2026.01) |

(52) U.S. Cl.
CPC ............ *B24B 37/24* (2013.01); *B24B 37/042* (2013.01); *B24B 37/22* (2013.01); *B24B 37/26* (2013.01); *B24D 11/001* (2013.01); *B24D 18/00* (2013.01); *H10P 72/0428* (2026.01)

(58) Field of Classification Search
CPC ....... B24B 37/24; B24B 37/042; B24B 37/22; B24B 37/26; B24B 37/04; B24B 37/20; B24B 37/11; B24D 11/001; B24D 18/00; B24D 3/06; H01L 21/67092; H01L 21/31053
See application file for complete search history.

(56) References Cited

U.S. PATENT DOCUMENTS

| | | | |
|---|---|---|---|
| 2002/0098701 A1 * | 7/2002 | Hasegawa ............... | B24B 37/24 438/692 |
| 2009/0253353 A1 | 10/2009 | Ogawa et al. | |
| 2018/0339393 A1 * | 11/2018 | Ahn ........................ | B24B 37/22 |

FOREIGN PATENT DOCUMENTS

| | | | | | |
|---|---|---|---|---|---|
| EP | 1129821 A1 | * | 9/2001 | ............. | B24B 37/24 |
| EP | 1211024 A2 | | 6/2002 | | |
| JP | 2000-343411 A | | 12/2000 | | |
| JP | 3452265 B1 | | 9/2003 | | |
| JP | 2004-526302 A | | 8/2004 | | |
| JP | 2006224282 A | * | 8/2006 | | |
| KR | 10-2001-0085976 A | | 9/2001 | | |
| KR | 2001-0085976 A | | 9/2001 | | |
| KR | 10-2001-0109154 A | | 12/2001 | | |
| KR | 10-2002-0042500 A | | 6/2002 | | |
| KR | 10-1799972 B1 | | 11/2017 | | |
| TW | 200528529 A | | 9/2005 | | |
| WO | 01/15860 A1 | | 3/2001 | | |

OTHER PUBLICATIONS

Jose3471, What is the oxidation No. of Zn . . . in ZnSO4? [retrieved from the internet at Aug. 30, 2025 from <URL:https://brainly.com/question/35898155>]. (Year: 2023).*
JP-2006224282-A, machine translation (Year: 2006).*
Office Action for the Korean Patent Application No. 10-2021-0059382 issued by the Korean Intellectual Property Office on Dec. 14, 2022.
Office Action for the Japanese Patent Application No. 2022-076342 issued by the Japanese Patent Office on Jun. 6, 2023.
Search Report for the Singapore Patent Application No. 10202204681S issued by the Intellectual Property Office of Singapore on Feb. 22, 2024.
Written Opinion for the Singapore Patent Application No. 10202204681S issued by the Intellectual Property Office of Singapore on Feb. 29, 2024.
Office Action for the Taiwanese Patent Application No. 111117059 issued by the Taiwanese Patent Office on Apr. 20, 2023.
Extended European Search Report for the European Patent Application No. 22171603.8 issued by the European Patent Office on Sep. 27, 2022.
Office Action for the Chinese Patent Application No. 202210479762.9 issued by the Chinese Patent Office on Nov. 28, 2023.

* cited by examiner

*Primary Examiner* — Marites A Guino-O Uzzle
(74) *Attorney, Agent, or Firm* — IP & T GROUP LLP

(57) ABSTRACT

A polishing pad includes a polishing layer, wherein the polishing layer includes zinc (Zn), and a concentration of the zinc (Zn) is 0.5 ppm to 40 ppm parts by weight based on the total weight of the polishing layer. In an exemplary embodiment, a polishing pad is provided wherein a concentration of the zinc (Zn) is 0.5 ppm to 40 ppm parts by weight based on the total weight of the polishing layer, a concentration of the iron (Fe) is 1 ppm to 50 ppm parts by weight based on the total weight of the polishing layer, and a concentration of the aluminum (Al) is 2 ppm to 50 ppm parts by weight based on the total weight of the polishing layer.

10 Claims, 2 Drawing Sheets

[FIG. 1A]
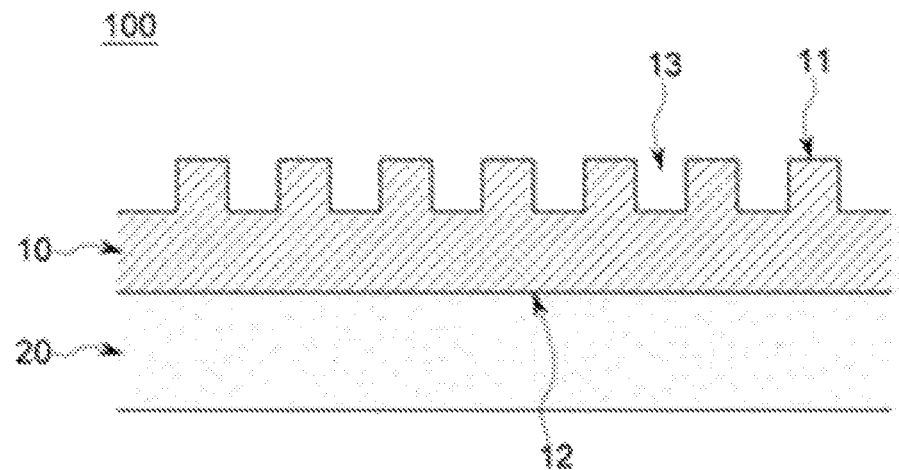
[FIG. 1B]
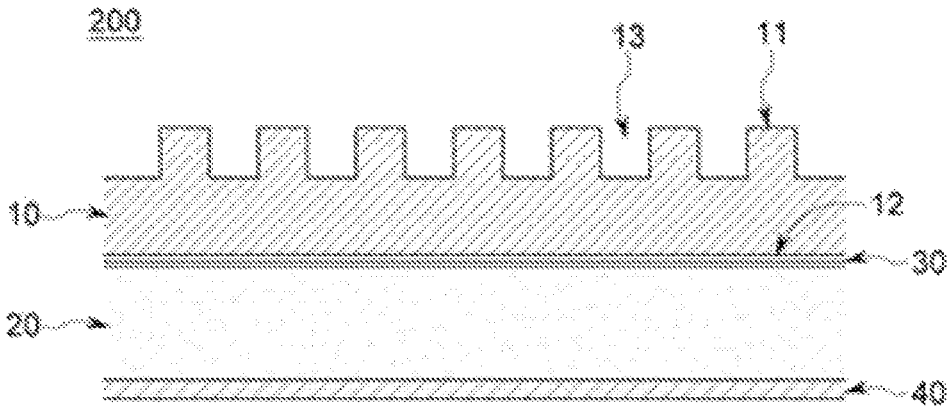

[FIG. 2]
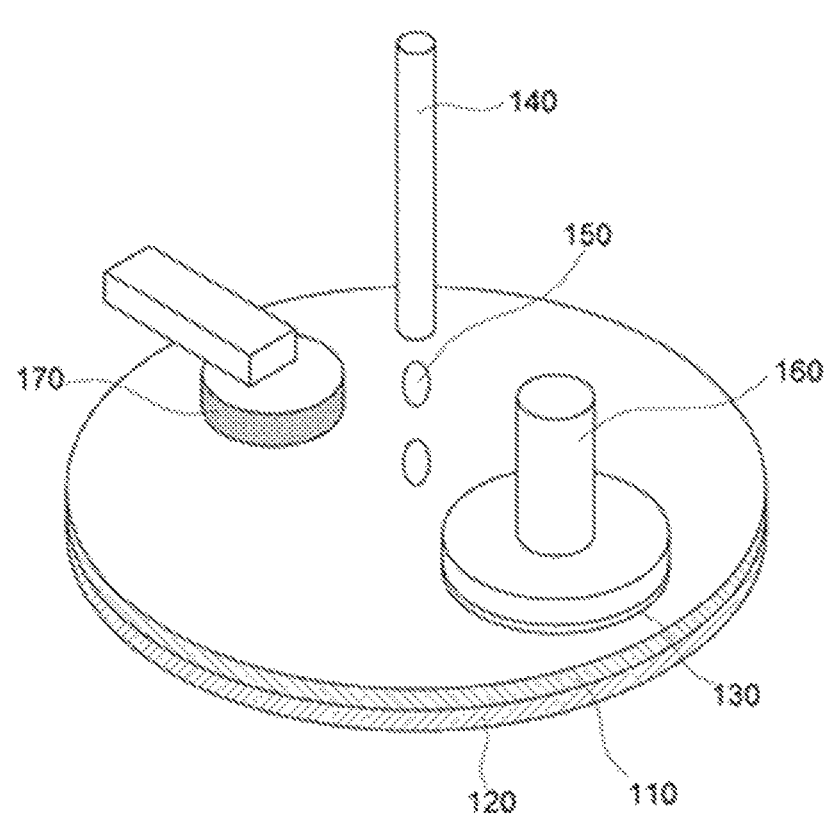

POLISHING PAD, METHOD FOR MANUFACTURING THE SAME, AND METHOD FOR MANUFACTURING SEMICONDUCTOR DEVICE USING THE SAME

TECHNICAL FIELD

The present disclosure relates to a polishing pad applied to a chemical mechanical planarization process of a semiconductor device, a method for manufacturing the same, and a method for manufacturing a semiconductor device using the same.

BACKGROUND ART

A chemical mechanical planarization (CMP) or chemical mechanical polishing (CMP) process has been used for various purposes in various fields. The CMP process is performed on a predetermined polished surface of an object to be polished, and may be performed for the purposes of planarization of the polished surface, removal of aggregated materials, resolution of crystal lattice damage, removal of scratches and pollution sources, etc.

A CMP process technology of a semiconductor process may be classified according to a film to be polished or a shape of a surface after being polished. For example, silicon may be divided into single silicon or polysilicon according to the film to be polished, and the CMP process technology may be classified into CMP processes of various oxide films or metal films of tungsten (W), copper (Cu), aluminum (Al), ruthenium (Ru), tantalum (Ta), etc. divided by a type of impurities. In addition, the CMP process technology may be classified into a process of alleviating roughness of a surface of a substrate, a process of planarizing a step generated due to multilayer circuit wirings, and a device isolation process for selectively forming circuit wirings after being polished, according to the shape of the surface after being polished.

The CMP process may be applied plural times in a process for manufacturing a semiconductor device. The semiconductor device includes a plurality of layers, and each layer includes complicated and fine circuit patterns. In addition, recently, the semiconductor device has evolved in such a way that individual chip sizes are reduced and patterns of each layer become more complicated and finer. Accordingly, in the process for manufacturing the semiconductor device, the purpose of the CMP process has been expanded in order to not only planarize the circuit wirings, but also isolate the circuit wirings and improve surfaces of the circuit wirings, and as a result, more sophisticated and reliable CMP performance has been required.

A polishing pad used in such a CMP process is a process component processing a polished surface to a required level through friction, and may be considered as one of the most important factors in thickness uniformity of a polishing object after being polished, flatness of the polished surface, a polishing quality, etc.

DISCLOSURE

Technical Problem

An embodiment provides a polishing pad having physical properties such as appropriate hardness, tensile strength, and elongation. An embodiment provides a polishing pad improving a polishing speed and preventing the occurrence of defects by appropriately adjusting electrical properties of the polishing pad and an adsorption degree between the polishing pad and a slurry during a polishing process.

Another embodiment provides a method for manufacturing a polishing pad having high process efficiency in polishing a semiconductor substrate.

Still another embodiment provides a method for manufacturing a semiconductor device having a higher polishing rate than a case where an existing polishing pad is applied and suppressing defects to the lowest level by applying the polishing pad according to an embodiment when a surface to be polished of the semiconductor substrate is polished.

Technical Solution

A polishing pad according to an embodiment includes a polishing layer, wherein the polishing layer includes zinc (Zn), and a concentration of the zinc (Zn) is 0.5 ppm to 40 ppm parts by weight based on the total weight of the polishing layer.

In an embodiment, the polishing layer further includes iron (Fe), and a concentration of the iron (Fe) may be 1 ppm to 50 ppm parts by weight based on the total weight of the polishing layer.

In an embodiment, the polishing layer further includes aluminum (Al), and a concentration of the aluminum (Al) may be 2 ppm to 50 ppm parts by weight based on the total weight of the polishing layer.

In an exemplary embodiment, the polishing layer has a total oxidizing power index of 1.5 to 10 represented by the following Equation 3:

$$\text{Total oxidizing power index} = (Con._{Al} \times Oxi._{Al}) + (Con._{Zn} \times Oxi._{Zn}) + (Con._{Fe} \times Oxi._{Fe})$$

wherein the $Con._{Al}$ is a concentration value in ppm of the weight of the aluminum (Al) based on the total weight of the polishing layer, the $Con._{Zn}$ is a concentration value in ppm of the weight of the zinc (Zn) based on the total weight of the polishing layer, the $Con._{Fe}$ is a concentration value in ppm of the iron (Fe) weight based on the total weight of the polishing layer, the $Oxi._{Al}$ is an ionization index of the aluminum (Al), and is a value obtained by dividing the reciprocal of the primary ionization energy of the aluminum (Al) by the sum of the reciprocal of the primary ionization energy of the aluminum (Al), the reciprocal of the primary ionization energy of the zinc (Zn), and the reciprocal of the primary ionization energy of the iron (Fe), the $Oxi._{Zn}$ is an ionization index of the zinc (Zn), and is a value obtained by dividing the reciprocal of the primary ionization energy of the zinc (Zn) by the sum of the reciprocal of the primary ionization energy of aluminum (Al), the reciprocal of the primary ionization energy of the zinc (Zn), and the reciprocal of the primary ionization energy of the iron (Fe), and the $Oxi._{Fe}$ is an ionization index of the iron (Fe), and is a value obtained by dividing the reciprocal of the primary ionization energy of the iron (Fe) by the sum of the reciprocal of the primary ionization energy of the aluminum (Al), the reciprocal of the primary ionization energy of the zinc (Zn), and the reciprocal of the primary ionization energy of the iron (Fe).

In one embodiment, the sum of the concentrations of the iron (Fe), the zinc (Zn), and the aluminum (Al) from a polishing surface of the polishing layer to a depth of ½ of a total thickness may be 8 ppm to 30 ppm parts by weight based on the total weight of the polishing layer.

In an exemplary embodiment, the polishing layer may have a hardness of 53 to 60 Shore D, and the polishing layer may have an elongation of 80 to 110%.

A method for manufacturing a polishing pad according to an exemplary embodiment may include: preparing a pre-composition containing a prepolymer; mixing zinc (Zn) with the pre-composition; preparing a composition for manufacturing a polishing layer including the pre-composition, a foaming agent, and a curing agent; and manufacturing a polishing layer having a concentration of zinc (Zn) of 0.5 ppm to 40 ppm parts by weight based on the total weight by curing the composition for manufacturing the polishing layer.

In an exemplary embodiment, the urethane-based prepolymer may include an isocyanate compound, the isocyanate compound may include at least one of an aromatic diisocyanate compound and an alicyclic diisocyanate compound, and the content of an isocyanate group in the urethane-based prepolymer may be 6% by weight to 12% by weight.

A method for manufacturing a semiconductor device according to an embodiment includes: providing a polishing pad including a polishing layer; and arranging the polished surface of an object to be polished to be in contact with the polishing surface of the polishing layer and then polishing the object to be polished while rotating relative to each other, wherein the object to be polished may include a semiconductor substrate, the polishing layer may include zinc (Zn), and the concentration of zinc (Zn) may be 0.5 ppm to 40 ppm parts by weight, based on the total weight of the polishing layer.

In an embodiment, the concentrations of the zinc (Zn), the iron (Fe), and the aluminum (Al) may be measured by inductively coupled plasma optical emission spectroscopy (ICP-OES).

In an embodiment, about 1 g of the polishing layer is dissolved in nitric acid and hydrochloric acid having a pH of 3 or less to prepare a polishing layer solution, and the polishing layer solution is pretreated at a temperature of 200° C. for about 16 hours, and then the concentration of the zinc (Zn), the iron (Fe), and the aluminum (Al) may be measured by inductively coupled plasma optical emission spectroscopy (ICP-OES). The concentration of each of the zinc (Zn), the iron (Fe), and the aluminum (Al) may be defined as a concentration value in which an average value of five measurements of the abovementioned method is based on the total weight of the polishing layer.

In an embodiment, the concentration of the zinc (Zn) may be 0.5 ppm to 40 ppm parts by weight based on the total weight of the polishing layer, the concentration of the iron (Fe) may be 1 ppm to 50 ppm parts by weight based on the total weight of the polishing layer, and the concentration of the aluminum (Al) may be 2 ppm to 50 ppm parts by weight based on the total weight of the polishing layer.

A method for manufacturing a semiconductor device according to an embodiment include: providing a polishing pad including a polishing layer; and arranging the polished surface of an object to be polished to be in contact with the polishing surface of the polishing layer and then polishing the object to be polished while rotating relative to each other, wherein the object to be polished may include a semiconductor substrate, the polishing layer may include zinc (Zn), and the concentration of zinc (Zn) may be 0.5 ppm to 40 ppm parts by weight based on the total weight of the polishing layer.

Advantageous Effects

Since the polishing pad includes a polishing layer containing each metal corresponding to a metal concentration exhibited by a processing composition treated therewith under predetermined conditions, the polishing surface of the polishing layer may exhibit appropriate hardness and electrical properties.

Accordingly, the polishing pad may exhibit a polishing rate and polishing flatness within a target range in polishing an object to be polished. In addition, the polishing pad contains the metal in an appropriate amount, such that the polishing pad has an increased adsorption to the slurry during a polishing process, and the polishing pad may have an improved polishing rate and improved polishing performance.

The method for manufacturing a semiconductor device using the polishing pad has high process efficiency for polishing a semiconductor substrate to be polished. Further, the method for manufacturing a semiconductor device according to an embodiment may allow a surface to be polished of the semiconductor substrate to have high polishing flatness and the lowest level of defects.

Furthermore, since the polishing pad according to the embodiment includes a metal component, electrical properties of the polishing surface may be appropriately adjusted. For example, since the polishing layer includes the metal component, the surface-modified polishing particles may be easily bonded to the polishing surface by electrostatic attraction.

In particular, the surface potential of the polishing surface may be controlled by the metal component so that the surface-modified polishing particles may be bonded to the polishing surface with an appropriate attraction.

Since the metal component has the total oxidizing power index as described above, the surface-modified polishing particles may be bonded to the polishing surface by an appropriate electrostatic attraction.

Accordingly, an appropriate amount of polishing particles may remain in the vicinity of the polishing surface with an appropriate bonding force. Thus, a semiconductor substrate such as a semiconductor wafer, etc. may be effectively polished by the polishing surface and the polishing particles.

BRIEF DESCRIPTION OF DRAWINGS

FIG. 1A schematically illustrates a cross-section of the polishing pad according to an embodiment.

FIG. 1B schematically illustrates a cross-section of the polishing pad according to an embodiment.

FIG. 2 schematically illustrates a process diagram of a method for manufacturing a semiconductor device according to an embodiment.

BEST MODE

Advantages and features of the present disclosure and methods accomplishing them will become apparent from exemplary embodiments to be described later. However, the present disclosure is not limited to exemplary embodiments disclosed below, and may be implemented in various different forms, these exemplary embodiments will be provided only in order to make the present disclosure complete and allow one of ordinary skill in the art to which the present disclosure pertains to completely recognize the scope of the present disclosure, and the present disclosure will be defined by the scope of the claims.

In the drawings, thicknesses are exaggerated in order to clearly represent several layers and areas. In addition, in the drawings, for convenience of description, thicknesses of some of layers and areas are exaggerated. Throughout the specification, the same reference numerals denote the same components.

In addition, in the present specification, when an element such as a layer, a film, a region, or a plate is referred to as being "on" another element, it may be directly on another element or may be on another element with the other element interposed therebetween. To the contrary, it will be understood that when any element is referred to as being "directly on" another element, an element may not be present therebeween. In addition, when an element such as a layer, a film, an area, or a plate is referred to as being "below" or "under" another element, it may be directly below another element or may be below another element with the other element interposed therebetween. To the contrary, it will be understood that when any element is referred to as being "directly below" another element, an element may be not present therebeween.

In an embodiment, there is provided a polishing pad including a polishing layer, wherein the polishing layer includes zinc (Zn), and a concentration of zinc (Zn) is 0.5 ppm to 40 ppm parts by weight based on the total weight of the polishing layer.

The polishing pad is a process component applied to a manufacturing process of a semiconductor device, and is one of the elements that should be accompanied by sophisticated process control according to the recent high integration of the semiconductor device. The polishing pad includes a polishing layer that directly transmits a polishing effect to the object to be polished, and components and physical properties of the polishing layer are factors that directly affect the polishing quality and polishing result of the object to be polished. The polishing pad according to an embodiment includes a polishing layer, wherein the polishing layer includes zinc (Zn) in a concentration of 0.5 ppm to 40 ppm parts by weight based on the total weight of the polishing layer, such that it is possible to implement an effect that electrical and physical properties may be optimized for polishing the object to be polished.

FIGS. 1A and 1B schematically illustrate cross-sections of the polishing pad according to an embodiment. Referring to FIG. 1A, the polishing pad 100 may include the polishing layer 10, and may include a cushion layer 20 on one surface of the polishing layer 10. The polishing layer 10 is in the form of a sheet having a predetermined thickness, and may include a first surface 11 functioning as a polishing surface in direct or indirect contact with a polished surface of an object to be polished, and a second surface 12, which is a back surface of the first surface 11.

In an embodiment, the cushion layer 20 has a thickness of about 0.5 mm to about 2.5 mm, for example, about 0.8 mm to about 2.5 mm, for example, about 1.0 mm to about 2.5 mm, for example, about 1.0 mm to about 2.0 mm, for example, about 1.2 mm to about 1.8 mm.

Referring to FIG. 1B, in an embodiment, the polishing pad 200 may include the polishing layer 10 and the cushion layer 20, and may further include a first adhesive layer 30 disposed at an interface between the polishing layer 10 and the cushion layer 20. For example, the first adhesive layer 30 may be derived from a heat-sealing adhesive, but the present disclosure is not limited thereto.

The polishing pad 200 may further include a second adhesive layer 40 disposed on the second surface 12 of the polishing layer 10. The second adhesive layer 40 is a configuration for attaching the polishing pad to a surface plate of a polishing apparatus, and may be disposed directly on the second surface 12 of the polishing layer 10, or as illustrated in FIG. 1B, may be disposed on other layers such as a cushion layer 20 on the polishing layer 10. For example, the second adhesive layer 40 may be derived from a pressure sensitive adhesive, but the present disclosure is not limited thereto.

The cushion layer 20 is disposed on the second surface 12 of the polishing layer 10 to support the polishing layer 10 and may serve to relieve external pressure or impact transmitted to a surface to be polished during the polishing process. Accordingly, it may contribute to preventing damage and defects to the object to be polished in the polishing process to which the polishing pad 100 is applied.

In an embodiment, the polishing pad may include a penetration region penetrating through the uppermost layer and the lowermost layer. The penetration region is a configuration for detecting a polishing end point during use of the polishing pad, and light having a predetermined wavelength condition may pass therethrough. In an embodiment, a light-transmitting window may be disposed in the penetration region. The light transmission window may have a transmittance of more than about 30%, for example, about 40% to about 80%, for light of any one wavelength of about 500 nm to about 700 nm.

The polishing layer may include a cured product of a pre-composition containing a urethane-based prepolymer. In an embodiment, the pre-composition may further contain a curing agent and a foaming agent. The "prepolymer" refers to a relatively low molecular weight polymer in which the polymerization degree is stopped at an intermediate stage to facilitate molding in the production of a cured product. The prepolymer itself may be subjected to an additional curing process such as heating and/or pressurization, or may be mixed and reacted with another polymerizable compound, for example, an additional compound such as a heterogeneous monomer or a heterogeneous prepolymer, and then molded into a final cured product.

In an embodiment, the urethane-based prepolymer may be prepared by reacting an isocyanate compound with a polyol compound.

As the isocyanate compound used in the preparation of the urethane-based prepolymer, one selected from the group consisting of aromatic diisocyanate, aliphatic diisocyanate, alicyclic diisocyanate, and combinations thereof may be used. In an embodiment, the isocyanate compound may include an aromatic diisocyanate.

The isocyanate compound may include, for example, one selected from the group consisting of 2,4-toluene diisocyanate (2,4-TDI), 2,6-toluene diisocyanate (2,6-TDI) naphthalene-1,5-diisocyanate, p-phenylene diisocyanate, tolidine diisocyanate, 4,4'-diphenylmethane diisocyanate, hexamethylene diisocyanate, dicyclohexylmethane diisocyanate, 4,4'-dicyclohexylmethane diisocyanate (Hi2MDI), isophorone diisocyanate and combinations thereof.

The "polyol" refers to a compound including at least two or more hydroxyl groups (—OH) per molecule. In an embodiment, the polyol compound may include a dihydric alcohol compound having two hydroxyl groups, that is, a diol or a glycol.

The polyol compound may include, for example, one selected from the group consisting of polyether polyol, polyester polyol, polycarbonate polyol, acryl polyol, and combinations thereof.

The polyol compound may include, for example, one selected from the group consisting of polytetramethylene ether glycol (PTMG), polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol (DEG), dipropylene glycol (DPG), tripropylene glycol, polypropylene glycol, and combinations thereof.

The polyol compound may have a weight average molecular weight (Mw) of about 100 g/mol to about 3,000 g/mol. For example, the polyol may have a weight average molecular weight (Mw) of about 100 g/mol to about 3,000 g/mol, for example, about 100 g/mol to about 2,000 g/mol, for example, about 100 g/mol to about 1,800 g/mol.

In an embodiment, the polyol compound may include a low molecular weight polyol having a weight average molecular weight (Mw) of greater than or equal to about 100 g/mol and less than about 300 g/mol, and a high molecular weight polyol having a weight average molecular weight (Mw) of greater than or equal to about 300 g/mol and less than or equal to about 1800 g/mol. In an embodiment, the high molecular weight polyol may include a first high molecular weight polyol having a weight average molecular weight (Mw) of greater than or equal to about 500 g/mol and less than or equal to about 800 g/mol; and a second high molecular weight polyol having a weight average molecular weight (Mw) greater than about 800 g/mol and less than or equal to about 1,800 g/mol. In this case, the polyol compound may form an appropriate cross-linked structure in the urethane-based prepolymer, and the polishing layer formed by curing the pre-composition including the urethane-based prepolymer under predetermined process conditions may be more advantageous to implement the abovementioned effect. The urethane-based prepolymer may have a weight average molecular weight (Mw) of about 500 g/mol to about 3,000 g/mol. The urethane-based prepolymer may have a weight average molecular weight (Mw) of, for example, about 600 g/mol to about 2,000 g/mol, for example, about 800 g/mol to about 1,000 g/mol. If the urethane-based prepolymer has a degree of polymerization corresponding to the aforementioned weight average molecular weight (Mw), a polishing layer formed by curing the pre-composition under predetermined process conditions may be more advantageous to have a chemical bonding structure for implementing the abovementioned excellent polishing properties.

In an embodiment, the isocyanate compound for preparing the urethane-based prepolymer may include an aromatic diisocyanate compound, and the aromatic diisocyanate compound may include, for example, 2,4-toluene diisocyanate (2,4-TDI) and 2,6-toluene diisocyanate (2,6-TDI). In addition, the polyol compound for preparing the urethane-based prepolymer may include, for example, polytetramethylene ether glycol (PTMG) and diethylene glycol (DEG).

In another embodiment, the isocyanate compound for preparing the urethane-based prepolymer may include an aromatic diisocyanate compound and an alicyclic diisocyanate compound. Examples of the aromatic diisocyanate compound may include 2,4-toluene diisocyanate (2,4-TDI) and 2,6-toluene diisocyanate (2,6-TDI), and examples of the alicyclic diisocyanate compound may include dicyclohexylmethane diisocyanate ($H_{12}MDI$). In addition, the polyol compound for preparing the urethane-based prepolymer may include, for example, polytetramethylene ether glycol (PTMG) and diethylene glycol (DEG).

In the pre-composition, the total amount of the polyol compound may be about 100 parts by weight to about 250 parts by weight, for example, about 120 parts by weight to about 250 parts by weight, for example, about 120 parts by weight to about 240 parts by weight, for example, about 150 parts by weight to about 240 parts by weight, for example, about 190 parts by weight to about 240 parts by weight, based on 100 parts by weight of the total amount of the isocyanate compound in the total components for preparing the urethane-based prepolymer.

In the pre-composition, when the isocyanate compound for preparing the urethane-based prepolymer includes the aromatic isocyanate compound, and the aromatic isocyanate compound includes 2,4-TDI and 2,6-TDI, the content of 2,6-TDI may be about 1 part by weight to about 40 parts by weight, for example, about 1 part by weight to about 30 parts by weight, for example, about 3 parts by weight to about 28 parts, for example, about 1 part by weight to about 10 parts by weight, based on 100 parts by weight of the 2,4-TDI.

In the pre-composition, when the isocyanate compound for preparing the urethane-based prepolymer includes the aromatic isocyanate compound and the alicyclic isocyanate compound, the content of the alicyclic isocyanate compound may be about 5 parts by weight to about 30 parts by weight, for example, about 10 parts by weight to about 25 parts by weight, based on 100 parts by weight of the total aromatic isocyanate compound. The pre-composition may have an isocyanate group content (NCO %) of about 6% to about 12% by weight, for example, about 6% to about 10% by weight, for example, about 6% to about 9% by weight. The isocyanate group content refers to a percentage by weight of isocyanate groups (—NCO) present as free reactive groups without urethane reaction in the total weight of the pre-composition. The isocyanate group content (NCO %) of the pre-composition may be designed by comprehensively controlling the types and contents of the isocyanate compound and the polyol compound for preparing the urethane-based prepolymer, process conditions such as temperature, pressure, and time of the process for producing the urethane-based prepolymer, and types and contents of additives used in the preparation of the urethane-based prepolymer.

The type of additive may include one selected from the group consisting of a surfactant, a pH adjuster, a binder, an antioxidant, a heat stabilizer, a dispersion stabilizer, and combinations thereof. The names such as "surfactant" and "antioxidant" are arbitrary names based on the main role of the corresponding material, and each corresponding material does not necessarily perform only a function limited to the role by the corresponding name.

Since the polishing pad according to an embodiment includes a polishing layer including zinc (Zn) in the abovementioned concentration, and satisfies the abovementioned structure and chemical composition, optimum polishing performance may be implemented when the polishing pad applied to a manufacturing process of a semiconductor device. Since the components caused by the chemical composition of the polishing layer and zinc (Zn) at a predetermined concentration interact, it may be advantageous for the polishing surface of the polishing layer to exhibit electrical properties suitable for polishing a semiconductor substrate including silicon (Si), copper (Cu), or tungsten (W).

The polishing layer may include a metal. The metal may be included in the polishing layer in the form of metal particles, metal ions, or metal salts. The metal salt may be an organic metal salt or an inorganic metal salt.

The metal may have an oxidation number of +1 to +3. For example, the metal may have an oxidation number of +2 to +3. By including the metal having such an oxidation number, the polishing performance of the polishing layer may be significantly improved. Specifically, when the polishing layer includes a metal having such an oxidation number, it is possible to form an optimal potential condition for flatly polishing the semiconductor substrate at an appropriate level of polishing rate while the polishing surface thereof is in contact with the semiconductor substrate to be polished.

Specifically, the metal may include one selected from the group consisting of zinc (Zn), iron (Fe), aluminum (Al), and combinations thereof.

More specifically, the polishing layer may include zinc (Zn). The zinc (Zn) may be included in the polishing layer in the form of an inorganic salt or an organic salt. For example, the zinc (Zn) may have an oxidation number of +2.

The concentration of zinc (Zn) included in the polishing layer may be about 0.5 ppm to about 40 ppm parts by weight, for example, about 1 ppm to about 40 ppm parts by weight, for example, about 2 ppm to 40 ppm parts by weight, for example, about 2 ppm to about 30 ppm parts by weight, based on the total weight of the polishing layer.

The polishing layer may further include iron (Fe). The iron (Fe) may be included in the polishing layer in the form of an inorganic salt or an organic salt. Here, the iron (Fe) may have an oxidation number of +2. The iron (Fe) may have an oxidation number of +3.

The concentration of iron (Fe) included in the polishing layer may be about 1 ppm to about 40 ppm parts by weight, for example, about 1 ppm to about 10 ppm parts by weight, for example, about 2 ppm to about 30 ppm, for example, about 2 ppm to 20 ppm parts by weight, for example, about 4 ppm to about 40 ppm parts by weight, for example, about 4 ppm to about 20 ppm parts by weight, based on the total weight of the polishing layer.

The polishing layer may further include aluminum (Al). The aluminum (Al) may be included in the polishing layer in the form of an inorganic salt or an organic salt. Here, the aluminum (Al) may have an oxidation number of +3.

The concentration of aluminum (Al) included in the polishing layer may be about 2 ppm to about 50 ppm parts by weight, for example, about 2 ppm to about 40 ppm parts by weight, for example, about 2 ppm to about 30 ppm, for example, about 2 ppm to about 20 ppm parts by weight, for example, about 2 ppm to about 10 ppm parts by weight, for example, about 3 ppm to about 50 ppm parts by weight, for example, about 3 ppm to 40 ppm parts by weight; for example, about 3 ppm to about 30 ppm parts by weight, for example, about 3 ppm to about 10 ppm parts by weight, based on the total weight of the polishing layer.

A sum of the concentrations of the zinc (Zn), the iron (Fe) and the aluminum (Al) included in the polishing layer may be about 5 ppm to about 40 ppm parts by weight, for example, about 7 ppm to about 35 ppm parts by weight, for example, about 5 ppm to about 30 ppm parts by weight, for example, about 8 ppm to 20 ppm parts by weight, for example, about 8 ppm to about 15 ppm parts by weight, for example, about 9 ppm to about 20 ppm parts by weight, for example, about 8 ppm to about 15 ppm parts by weight, based on the total weight of the polishing layer.

The concentration of the metal included in the polishing layer may be measured by the following method.

The concentration of the metal included in the polishing layer may be measured by inductively coupled plasma optical emission spectrometry (ICP-OES).

The concentration of the metal in the polishing pad measured by the ICP-OES may be a number average value measured in the same manner at least five times with for the polishing layer. For example, samples are taken for each random position of the polishing layer and dissolved in acid, the mass of the metal contained in each sample may be measured by the ICP-OES method, and the concentration of the metal may be calculated based on the mass of each sample. The sample may have a mass of about 0.5 g to about 3 g. The sample may have a mass of about 1 g.

After the polishing layer is dissolved in nitric acid and hydrochloric acid, and the solution is pretreated at a temperature of about 200° C. for about 16 hours, the concentration of the metal may be measured by the ICP-OES. In addition, the concentration of the metal included in the polishing layer may be generally uniform. For example, the polishing layer may be divided into a plurality of grids in a square of 1 cm×1 cm when viewed from the top. The grids may have a uniform metal concentration. The grids may have a standard deviation of a metal concentration of about 5 ppm or less. The grids may have a standard deviation of a metal concentration of about 4 ppm. The grids may have a standard deviation of a metal concentration of about 3 ppm.

In the present specification, in the concentration of each metal, an average value measured five times by the above-mentioned method is defined as a concentration value based on the total weight of the polishing layer.

In addition, the sample may be taken at a random location from the polishing surface of the polishing layer to a depth of ½ of the total thickness. A sample of a region to a depth of ½ from the polishing surface may be measured by the ICP-OES, and a metal concentration to a depth of ½ from the polishing surface may be measured.

Each concentration of zinc (Zn), iron (Fe), and aluminum (Al) in the polishing layer may satisfy the abovementioned range over the entire thickness range of the polishing layer. More specifically, each concentration of zinc (Zn), iron (Fe), and aluminum (Al) in the polishing layer may satisfy the abovementioned range in the region from the polishing surface to a depth of ½ of the thickness of the polishing layer.

The concentration of the sum of zinc (Zn), iron (Fe), and aluminum (Al) in the polishing layer may satisfy the abovementioned range over the entire thickness range of the polishing layer. More specifically, the concentration of the sum of zinc (Zn), iron (Fe), and aluminum (Al) in the polishing layer may satisfy the abovementioned range in the region from the polishing surface to a depth of ½ of the thickness of the polishing layer.

Each concentration of zinc (Zn), iron (Fe), and aluminum (Al) or the concentration of the sum thereof satisfies the abovementioned range, particularly in the region from the polishing surface to a depth of ½ of the thickness of the polishing layer, and thus, it is possible to obtain the effect of providing uniform polishing performance throughout the polishing process in which the surface is polished while being cut with the conditioner.

The concentration of zinc (Zn) included in the polishing layer may be about 0.5 ppm to about 40 ppm parts by weight, for example, about 1 ppm to about 40 ppm parts by weight, for example, about 2 ppm to about 40 ppm parts by weight, for example, about 2 ppm to about 30 ppm parts by weight, based on the total weight in a region from the polishing surface to a depth of ½ of the thickness of the polishing layer.

The concentration of iron (Fe) included in the polishing layer may be about 1 ppm to about 40 ppm parts by weight, for example, about 1 ppm to about 10 ppm parts by weight, for example, about 2 ppm to about 30 ppm, for example, about 2 ppm to 20 ppm parts by weight, for example, about 4 ppm to about 40 ppm parts by weight, for example, about 4 ppm to about 20 ppm parts by weight, based on the total weight in a region from the polishing surface to a depth of ½ of the thickness of the polishing layer.

The concentration of aluminum (Al) included in the polishing layer may be about 2 ppm to about 50 ppm parts by weight, for example, about 2 ppm to about 40 ppm parts by weight, for example, about 2 ppm to about 30 ppm, for example, about 2 ppm to about 20 ppm parts by weight, for example, about 2 ppm to about 10 ppm parts by weight, for example, about 3 ppm to about 50 ppm parts by weight, for example, about 3 ppm to 40 ppm parts by weight, for example, about 3 ppm to about 30 ppm parts by weight, for example, about 3 ppm to about 10 ppm parts by weight, based on the total weight in a region from the polishing surface to a depth of ½ of the thickness of the polishing layer.

The sum of the concentrations of the zinc (Zn), the iron (Fe), and the aluminum (Al) included in the polishing layer may be about 5 ppm to about 40 ppm parts by weight, for example, about 7 ppm to about 35 ppm parts by weight, for example, about 5 ppm to about 30 ppm parts by weight, for example, about 8 ppm to 20 ppm parts by weight, for example, about 8 ppm to about 15 ppm parts by weight, for example, about 9 ppm to about 20 ppm parts by weight, for example, about 8 ppm to about 15 ppm parts by weight, based on the total weight in a region from the polishing surface to a depth of ½ of the thickness of the polishing layer.

In particular, the surface of the polishing layer may be cut by a conditioner, etc. when the semiconductor substrate is polished. Accordingly, in the polishing layer, a region mainly in contact with the semiconductor substrate may be from the polishing surface to a depth of about ½ of the thickness of the polishing layer. Thus, when the metal concentration from the polishing surface to a depth of about ½ of the thickness of the polishing layer has the above range, the polishing pad according to the embodiment may have improved performance.

Since the polishing layer includes the metal in an appropriate concentration, the polishing pad according to the embodiment may have improved polishing performance More specifically, the polishing layer may include appropriate concentrations of each of the iron (Fe), the aluminum (Al), and the zinc (Zn), and thus may have appropriate physical properties such as hardness and elongation. Also, the metal may improve an adsorption degree between the slurry used for chemical mechanical polishing and the polishing surface by adjusting the electrical properties of the polishing pad according to the embodiment. As a result, the polishing pad according to the embodiment may implement polishing performance such as a desired level of polishing rate (RR) and low defects.

More specifically, when the polishing layer according to an embodiment includes each of zinc (Zn), iron (Fe) and aluminum (Al) or combinations thereof at the abovementioned concentrations, at the same time, when the structure and chemical composition of the polishing layer satisfy the above properties, optimal polishing performance may be implemented when the polishing layer is applied to the manufacturing process of a semiconductor device. That is, elements and molecular components caused by the chemical composition of the polishing layer interact with zinc (Zn), iron (Fe) and aluminum (Al) in appropriate concentrations, such that the polishing surface of the polishing layer may be advantageous to exhibit physical and electrical properties suitable for polishing a semiconductor substrate including silicon (Si), copper (Cu), or tungsten (W).

For example, when the concentration of the zinc (Zn) in the polishing layer has the above range and the total concentration of the metal in the polishing layer satisfies the above range, the polishing layer may have appropriate hardness and elongation. In addition, since the polishing layer includes the metal in an appropriate concentration, adsorption properties of the polishing surface and the polishing particles included in the slurry may be appropriately improved. As a result, the polishing pad according to the embodiment may implement a desired polishing rate and an effect of reducing defects.

When the concentration of zinc (Zn) in the polishing layer satisfies the abovementioned range and the concentration of iron (Fe) and aluminum (Al) satisfies the abovementioned range, the polishing layer may have appropriate hardness and elongation due to an appropriate metal concentration. In addition, since the polishing layer has an appropriate metal concentration, it may have appropriate electrical properties and proper adsorption and desorption properties with the slurry. As a result, the polishing pad according to the embodiment may implement a desired polishing rate and an effect of reducing defects.

As described above, the sum of the concentrations of the iron (Fe), the zinc (Zn), and the aluminum (Al) from the polishing surface of the polishing layer to a depth of ½ of the total thickness may have the above range.

When the sum of the concentrations of the iron (Fe), the zinc (Zn), and the aluminum (Al) is excessively low outside the above range, the hardness of the polishing layer may be lower than necessary, which may be disadvantageous in implementing a desired polishing rate. On the contrary, when the sum of the concentrations of the iron (Fe), the zinc (Zn), and the aluminum (Al) is excessively high outside the above range, there is a concern that the hardness of the polishing layer may be higher than necessary, thereby increasing the occurrence of defects such as scratches on a surface of a semiconductor substrate to be polished.

Meanwhile, during the polishing process, the metal in the polishing layer and the slurry applied to the polishing surface may be physically or chemically bonded. The polishing pad according to an embodiment has an improved polishing rate, polishing flatness, and an effect of reducing defects in terms of physical or chemical bonding with the slurry component because the sum of the concentrations of the iron (Fe), the zinc (Zn), and the aluminum (Al) in the polishing layer satisfies an appropriate range. In this case, the physical or chemical bond may include, but not limited to, one selected from the group consisting of an electrical bond, a covalent bond, an ionic bond, a coordination bond, a van der Waals force, an electrostatic repulsion force and a hydrogen bond, and combinations thereof. That is, when the sum of the concentrations of the iron (Fe), the zinc (Zn), and the aluminum (Al) in the polishing layer is excessively high or low outside the abovementioned range, because the physical or chemical bonding force with the components in the slurry is excessively high or lower, there is a concern that an appropriate level of adhesion and detachment force may not be ensured. When the adhesion of the components in the slurry is excessively strong it is difficult to be detached, there is a concern that scratches may occur on the surface of the semiconductor substrate to be polished, and when the adhesion of the components in the slurry is excessively weak, it may be difficult to implement a desired level of polishing rate.

In an embodiment, the polishing layer may have a total oxidizing power index represented by Equation 2 or Equation 3 below. The polishing layer may have a total oxidizing power index of about 1.5 to about 10.

In order to calculate the total oxidizing power index, the ionization index $(Oxi._x)$ may be defined by Equation 1 below:

$$Oxi._x = \frac{(1/E_x)}{\sum(1/E_x)} \qquad \text{[Equation 1]}$$

Wherein x is a metal included in the polishing layer. The x may be a metal included in a significant amount in the polishing layer.

The x may be the zinc (Zn), the iron (Fe), or the aluminum (Al).

The $E_x$ is a primary ionization energy of the metal x.

The $\sum(1/E_x)$ is a sum of a reciprocal of the primary ionization energies of each metal included in the polishing layer.

The ionization index may function as an index indicating the possibility that a physical or chemical bond between the metal included in the polishing layer and the polishing particles included in the slurry, for example, an ionic bond or an electrical bond may occur. In addition, the ionization index of the metal included in the polishing layer may have a strong effect on a physical and chemical bond between the polishing pad and the slurry.

Specifically, the zinc (Zn), the iron (Fe), and the aluminum (Al) are metals having an ionization energy, and may form an organic/inorganic bond with the components of the slurry. The ionization energy is energy required to remove an electron from an atom or molecule, and as the higher the ionization energy, the more difficult it is to remove the electron, and the lower the ionization energy, the stronger the tendency to become a cation, so it may be said that the reactivity is high.

Using this, the ionization index represented as an index to calculate the ionization degree of the zinc (Zn), the iron (Fe) and the aluminum (Al) in the polishing pad in a relative ratio, is a value obtained by dividing reciprocals of the primary ionization energies of each of the zinc (Zn), the iron (Fe), and the aluminum (Al) by a sum of a reciprocal of the primary ionization energy of aluminum (Al), a reciprocal of the primary ionization energy of zinc (Zn), and a reciprocal of the primary ionization energy of iron (Fe). That is, in the case of each metal included in the polishing layer, the greater the ionization index of the metal, the greater the reactivity with the slurry components. Conversely, the smaller the ionization index of the metal, the lower the reactivity with the slurry component. As described above, the ionization index of each metal may function as an index representing a physical or chemical bonding force with components in the slurry in relation to their reactivity. As will be described later, a predetermined numerical range may function as a factor constituting an oxidizing power index having a technical significance representing an optimal performance implementation in relation to the polishing performance of the polishing pad. The total oxidizing power index may be expressed by Equation 2 below.

For example, the total oxidizing power index may be the sum of the value obtained by multiplying the ionization index of the metal x by a value of the concentration (ppm) of the metal x, and multiplying each ionization index by a value of the concentration (ppm). With respect to the factor constituting the total oxidizing power index, the concentration of the metal x is a value having a ppm unit derived using ICP-OES as described above, but only the numerical value is used as a factor constituting the oxidizing power index. In addition, the ionization index of the metal x itself is a value without a unit. Accordingly, the oxidizing power index, which is defined as the sum of the concentration of the metal x and the value of the ionization index of the metal x, is expressed as an index without a unit.

$$\text{Total oxidizing power index} = \Sigma(Con._x \times Oxi._x) \qquad \text{[Equation 2]}$$

wherein $Con._x$ is a concentration value in ppm of the weight of the metal x based on the total weight of the polishing layer.

For example, the metal may be the zinc (Zn), the iron (Fe), and the aluminum (Al).

For example, the total oxidizing power index may be represented by Equation 3 below:

$$\text{Total oxidizing power index} = (Con._{Al} \times Oxi._{Al}) + (Con._{Zn} \times Oxi._{Zn}) + (Con._{Fe} \times Oxi._{Fe})$$

wherein the $Con._{Al}$ is a concentration value in ppm of the weight of the aluminum (Al) based on the total weight of the polishing layer, the $Con._{Zn}$ is a concentration value in ppm of the weight of the zinc (Zn) based on the total weight of the polishing layer, and the $Con._{Fe}$ is a concentration value in ppm of the iron (Fe) weight based on the total weight of the polishing layer, the $Oxi._{Al}$ is an ionization index of the aluminum (Al), and is a value obtained by dividing the reciprocal of the primary ionization energy of the aluminum (Al) by the sum of the reciprocal of the primary ionization energy of the aluminum (Al), the reciprocal of the primary ionization energy of the zinc (Zn), and the reciprocal of the primary ionization energy of the iron (Fe).

the $Oxi._{Zn}$ is an ionization index of the zinc (Zn), and is a value obtained by dividing the reciprocal of the primary ionization energy of the zinc (Zn) by the sum of the reciprocal of the primary ionization energy of aluminum (Al), the reciprocal of the primary ionization energy of the zinc (Zn), and the reciprocal of the primary ionization energy of the iron (Fe), and the $Oxi._{Fe}$ is an ionization index of the iron (Fe), and is a value obtained by dividing the reciprocal of the primary ionization energy of the iron (Fe) by the sum of the reciprocal of the primary ionization energy of the aluminum (Al), the reciprocal of the primary ionization energy of the zinc (Zn), and the reciprocal of the primary ionization energy of the iron (Fe).

The total oxidizing power index may be about 2 to about 9, for example, about 2 to about 8, for example, about 3 to about 7, for example, about 2 to about 7.

The total oxidizing power index may be a degree of bond between the polishing layer and the polishing particles included in the slurry caused by the metal included in the polishing layer. For example, the total oxidizing power index may indicate a degree of the bonding force between the polishing layer and the polishing particles included in the slurry by the zinc (Zn), the iron (Fe) and the aluminum (Al).

For example, the total oxidizing power index may be an index of electrical properties of the polishing layer. That is, the polishing pad having an appropriate total oxidizing power index of the polishing layer may easily physically or chemically bond the polishing particles included in the slurry to a surface to be polishedWhen the total oxidizing power index is within a predetermined range, the polarity of the polishing layer is ensured at an appropriate level, and thus the surface to be polished may have an appropriate charge. Accordingly, the repulsive force due to the electrostatic repulsive force between the surface to be polished and the polishing particles included in the slurry may be reduced.

As a result, the polishing pad according to the embodiment may substantially increase the polishing participation of the polishing particles included in the slurry, and may have an improved polishing rate.

In addition, since the total oxidizing power index is appropriate, the interaction between the polishing layer and the polishing particles included in the slurry may be appropriate during the polishing process. Accordingly, the polishing particles included in the slurry are easily adsorbed to the polishing pad to increase the polishing rate, and are easily detached between the polishing particles included in the slurry and the surface to be polished, thereby reducing a defect of a wafer to be polished. Thus, when the total oxidizing power index is within the above range, it may be more advantageous for the polishing layer to implement a target level of polishing performance.

In the polishing pad according to the embodiment, the surface to be polished and the slurry are in direct or indirect contact with each other, and a polishing process is performed. Accordingly, the metal component included in the polishing layer improves a friction-inducing level of the surface to be polished and adsorption/desorption and dispersion ability with slurry, and thus is an important factor in improving the polishing performance of the polishing pad according to the embodiment.

The electrical properties of the polishing layer constituting the polishing pad according to an embodiment affect the degree of change in adsorption/desorption between the surface of the slurry particles and the polishing pad, and polishing performance Specifically, the metal concentration in the polishing layer is one of the important factors that may change the electrical properties in the polishing layer, and in order to objectively evaluate the adsorption degree of the polishing layer and the slurry, the present disclosure is intended to objectively evaluate the polishing performance of the polishing layer by introducing the concept of the total oxidizing power index. Therefore, the total oxidizing power index indicates the degree of adsorption between the polishing layer and the slurry, and may be an index capable of confirming the degree of polishing rate and planarization performance of the polishing pad through the degree of adsorption of the polishing layer and the slurry during the polishing process.

The metal may be added into the polishing layer. The metal may be added by selecting at least one from the group consisting of metal salts, metal particles, metal binders, and combinations thereof. For example, the metal salt, the metal particles, or the metal binders may be added into the polishing layer as an independent additive, or may be added in a mixed state with other components for forming the polishing layer.

The metal may be added to the polishing layer in the form of a metal salt. For example, the metal or metal salt may include, but is not limited to, one selected from the group consisting of iron chloride, iron bromide, iron chloride anhydrous, iron oxide, iron acetate, aluminum chloride anhydrous, aluminum bromide, aluminum oxide, aluminum triacetate, zinc chloride, zinc bromide, zinc oxide, zinc acetate, and combinations thereof.

In addition, the content of the metal may be adjusted to have the above range by addition. Further, the metal may be added to the polishing layer by a reactor, a raw material supply line, a raw material, or a surrounding environment. Here, in the present embodiment, the content of the metal may be appropriately adjusted to have the above range by various methods such as addition of a metal salt.

In an embodiment, the metal concentration measured by the ICP-OES after the polishing layer is dissolved in nitric acid and hydrochloric acid having a pH of 3 or less, and the lysate is pretreated at about 200° C. for about 16 hours, is related to the hardness and electrical properties of the polishing layer and the degree of adsorption and desorption with the slurry.

However, a technical purpose of the polishing pad according to an embodiment is that, when the metal concentration in the polishing layer, which is measured by ICP-OES of the processing composition, satisfies the abovementioned condition, the resulting polishing performance of the polishing pad may be implemented at a desired level. That is, within the range that satisfies these technical purposes, even if slightly different types and contents of monomers, slightly different process conditions, etc. are applied, it cannot be regarded as deviating from the scope of rights of the present disclosure.

The curing agent is a compound for chemically reacting with the urethane-based prepolymer to form a final cured structure in the polishing layer, and may include, for example, an amine compound or an alcohol compound. Specifically, the curing agent may include one selected from the group consisting of aromatic amines, aliphatic amines, aromatic alcohols, aliphatic alcohols, and combinations thereof.

For example, the curing agent may include one selected from the group consisting of 4,4'-methylenebis(2-chloroaniline) (MOCA), diethyltoluenediamine (DETDA), diaminodiphenylmethane, dimethyl thio-toluene diamine (DMTDA), propanediol bis p-aminobenzoate, methylene bis-methylanthranilate, diaminodiphenylsulfone, m-xylenediamine, isophoronediamine, ethylenediamine, diethylenetriamine, triethylenetetramine, polypropylenediamine, polypropylenetriamine, bis(4-amino-3-chlorophenyl) methane), and combinations thereof.

The content of the curing agent may be about 18 parts by weight to about 28 parts by weight, for example, about 19 parts by weight to about 27 parts by weight, for example, about 20 parts by weight to about 26 parts by weight, based on 100 parts by weight of the pre-composition. When the content of the curing agent satisfies the above range, it may be more advantageous to implement the desired performance of the polishing pad.

When the curing agent includes an amine compound, a molar ratio of isocyanate (NCO) groups in the pre-composition to amine ($NH_2$) groups in the curing agent may be about 1:0.60 to about 1:0.99, for example, about 1:0.60 to about 1:0.95, for example, greater than or equal to about 1:0.60 and less than about 1:0.90.

The foaming agent is a component for forming a pore structure in the polishing layer, and may include one selected from the group consisting of a solid foaming agent, a gas foaming agent, a liquid foaming agent, and combinations thereof. In an embodiment, the foaming agent may include a solid foaming agent, a gas foaming agent, or combinations thereof.

The solid foaming agent may have an average particle size of about 5 μm to about 200 μm, for example, about 20 μm to about 50 μm, for example, about 21 μm to about 50 μm, for example, about 21 μm to about 40 μm. The average particle size of the solid foaming agent may refer to an average particle size of the thermally expanded particles themselves when the solid foaming agent is thermally expanded particles as described below, and refer to an average particle size of the particles after expansion by heat or pressure when the solid foaming agent is unexpanded particles as described below.

The solid foaming agent may include expandable particles. The expandable particles are particles having a property of being expandable by heat or pressure, and the size in the final polishing layer may be determined by heat or pressure, etc. applied during the manufacturing process of the polishing layer. The expandable particles may include thermally expanded particles, unexpanded particles, or combinations thereof. The thermally expanded particles are particles pre-expanded by heat, and refer to particles with little or no size change by heat or pressure applied during the manufacturing process of the polishing layer. The unexpanded particles are particles that have not been expanded in advance, and refer to particles whose final size is determined by being expanded by heat or pressure applied during the manufacturing process of the polishing layer.

The expandable particles may include a shell made of a resin material; and an expansion-inducing component present in the interior enclosed by the shell.

For example, the shell may include a thermoplastic resin, and the thermoplastic resin may be at least one selected from the group consisting of a vinylidene chloride-based copolymer, an acrylonitrile-based copolymer, a methacrylonitrile-based copolymer, and an acrylic-based copolymer.

The expansion-inducing component may include one selected from the group consisting of a hydrocarbon compound, a chlorofluoro compound, a tetraalkylsilane compound, and combinations thereof.

Specifically, the hydrocarbon compound may include one selected from the group consisting of ethane, ethylene, propane, propene, n-butane, isobutene, n-butene, isobutene, n-pentane, isopentane, neopentane, n-hexane, heptane, petroleum ether, and combination thereof.

The chlorofluoro compound may include one selected from the group consisting of trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and combination thereof.

The tetraalkylsilane compound may include one selected from the group consisting of tetramethylsilane, trimethylethylsilane, trimethylisopropylsilane, trimethyl-n-propylsilane, and combinations thereof.

The solid foaming agent may optionally include inorganic component-treated particles. For example, the solid foaming agent may include inorganic component-treated expandable particles. In an embodiment, the solid foaming agent may include silica ($SiO_2$) particle-treated expandable particles. The inorganic component treatment of the solid foaming agent may prevent aggregation between a plurality of particles. The inorganic component-treated solid foaming agent may have chemical, electrical and/or physical properties of the foaming agent surface that differ from those of the inorganic component-untreated solid foaming agent.

The content of the solid foaming agent may be about 0.5 parts by weight to about 10 parts by weight, for example, about 1 part by weight to about 3 parts by weight, for example, about 1.3 parts by weight to about 2.7 parts by weight, for example, about 1.3 parts by weight to about 2.6 parts by weight, based on 100 parts by weight of the urethane-based prepolymer.

The type and content of the solid foaming agent may be designed according to the desired pore structure and physical properties of the polishing layer.

The gas foaming agent may include an inert gas. The gas foaming agent may be used as a pore-forming element by being added during a reaction between the urethane-based prepolymer and the curing agent.

The type of inert gas is not particularly limited as long as it does not participate in the reaction between the urethane-based prepolymer and the curing agent. For example, the inert gas may include one selected from the group consisting of nitrogen gas ($N_2$), argon gas (Ar), helium gas (He), and combinations thereof. Specifically, the inert gas may include nitrogen gas ($N_2$) or argon gas (Ar).

The type and content of the gas foaming agent may be designed according to the desired pore structure and physical properties of the polishing layer.

In an embodiment, the foaming agent may include a solid foaming agent. For example, the foaming agent may be formed of only a solid foaming agent.

The solid foaming agent may include expandable particles, and the expandable particles may include thermally expanded particles. For example, the solid foaming agent may consist only of thermally expanded particles. When the solid foaming agent does not include the unexpanded particles and consists only of thermally expanded particles, the variability of the pore structure is degraded, but the predictability is increased, ant thus it may be advantageous to implement homogeneous pore properties over the entire area of the polishing layer.

In an embodiment, the thermally expanded particles may be particles having an average particle size of about 5 μm to about 200 μm. The average particle size of the thermally expanded particles may be about 5 μm to about 100 μm, for example, about 10 μm to about 80 μm, for example, about 20 μm to about 70 μm, for example, about 20 μm to about 50 μm, for example, about 30 μm to about 70 μm, for example, about 25 μm to 45 μm, for example, about 40 μm to about 70 μm, for example about 40 μm to about 60 μm. The average particle size is defined as the D50 of the thermally expanded particles.

In an embodiment, the thermally expanded particles may have a density of about 30 kg/m³ to about 80 kg/m³, for example, about 35 kg/m³ to about 80 kg/m³, for example, about 35 kg/m³ to about 75 kg/m³, for example, about 38 kg/m³ to about 72 kg/m³, for example, about 40 kg/m³ to about 75 kg/m³, for example, about 40 kg/m³ to about 72 kg/m³.

In an embodiment, the foaming agent may include a gas foaming agent. For example, the foaming agent may include a solid foaming agent and a gas foaming agent. The matters of the solid foaming agent are the same as described above.

The gas foaming agent may include nitrogen gas.

The gas foaming agent may be injected through a predetermined injection line during a process of mixing the urethane-based prepolymer, the solid foaming agent, and the curing agent. The injection rate of the gas foaming agent may be about 0.8 L/min to about 2.0 L/min, for example, about 0.8 L/min to about 1.8 L/min, for example, about 0.8 L/min to about 1.7 L/min, for example, about 1.0 L/min to about 2.0 L/min, for example, about 1.0 L/min to about 1.8 L/min, for example, about 1.0 L/min to about 1.7 L/min.

The composition for preparing the polishing layer may further contain other additives such as a surfactant and a reaction rate regulator. The names such as "surfactant" and "reaction rate regulator" are arbitrary names based on the main role of the corresponding material, and each corresponding material does not necessarily perform only a function limited to the role by the corresponding name.

The surfactant is not particularly limited as long as it serves to prevent aggregation or overlapping of pores. For example, the surfactant may include a silicone-based surfactant.

The surfactant may be used in an amount of about 0.2 parts by weight to about 2 parts by weight, based on 100 parts by weight of the urethane-based prepolymer. Specifically, the surfactant may be included in an amount of about 0.2 parts by weight to about 1.9 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, for example, about 0.5 parts by weight to 1.5 parts by weight, based on 100 parts by weight of the urethane-based prepolymer. When the surfactant is included in an amount within the above range, the gas foaming agent-derived pores may be stably formed and maintained in a mold.

The reaction rate regulator serves to promote or delay the reaction, and may use a reaction accelerator, a reaction retarder, or both according to the purpose. The reaction rate regulator may include a reaction accelerator. For example, the reaction accelerator may be one or more reaction accelerators selected from the group consisting of a tertiary amine-based compound and an organometallic compound.

Specifically, the reaction rate regulator may include at least one selected from the group consisting of triethylene-diamine, dimethylethanolamine, tetramethylbutanediamine, 2-methyl-triethylenediamine, dimethylcyclohexylamine, tri-ethylamine, triisopropanolamine, 1,4-diazabicyclo(2,2,2)oc-tane, bis(2-methylaminoethyl)ether, trimethylaminoethyl-ethanolamine, pentamethyldiethylenetriamine, dimethylaminoethylamine, dimethylamino propylamine, benzyldimethylamine, N-ethylmorpholine, N,N-dimethyl-aminoethylmorpholine, N,N-dimethylcyclohexylamine, 2-methyl-2-azanovonein, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate regulator may include one or more selected from the group consisting of benzyldimethylamine, N,N-dimethylcyclohexylamine, and triethylamine.

The reaction rate regulator may be used in an amount of about 0.05 parts by weight to about 2 parts by weight, based on 100 parts by weight of the urethane-based prepolymer. Specifically, the reaction rate regulator may be used in an amount of about 0.05 parts by weight to about 1.8 parts by weight, for example, about 0.05 parts by weight to about 1.7 parts by weight, for example, about 0.05 parts by weight to about 1.6 parts by weight, for example, about 0.1 parts by weight to about 1.5 parts by weight, for example, about 0.1 parts by weight to about 0.3 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example about 0.2 parts by weight to about 1.5 parts by weight, for example, about 0.5 parts by weight to about 1 parts by weight, based on 100 parts by weight of the urethane-based prepolymer. When the reaction rate regulator is used in the abovementioned content range, the polishing layer having the desired size of pores and hardness may be formed by appropriately adjusting the curing reaction rate of the pre-composition.

When the polishing pad includes a cushion layer, the cushion layer may serve to absorb and disperse an external shock applied to the polishing layer while supporting the polishing layer, thereby minimizing damage and defects to the object to be polished during the polishing process to which the polishing pad is applied.

The cushion layer may include, but is not limited to, nonwoven fabric or suede.

In an embodiment, the cushion layer may be a resin-impregnated nonwoven fabric. The nonwoven fabric may be a fiber nonwoven fabric including one selected from the group consisting of polyester fibers, polyamide fibers, poly-propylene fibers, polyethylene fibers, and combinations thereof.

The resin impregnated into the nonwoven fabric may include one selected from the group consisting of a poly-urethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicone rub-ber resin, a polyester-based elastomer resin, a polyamide-based elastomer resin, and combinations thereof.

In the polishing pad according to an embodiment, a hardness (Shore D) of the polishing surface of the polishing layer may be less than about 50, for example, 30 Shore D to 80 Shore D. Specifically, the hardness of the polishing layer may be 40 Shore D to 80 Shore D, 50 Shore D to 80 Shore D, 40 Shore D to 70 Shore D, 50 Shore D to 70 Shore D, or 55 Shore D to 65 Shore D. However, the present disclosure is not limited thereto.

The polishing layer may have a tensile strength of less than about 25 N/mm$^2$, for example, greater than or equal to about 10 N/mm$^2$ and less than about 25 N/mm$^2$, for example, about 15 N/mm$^2$ to about 25 N/mm$^2$. The elongation of the polishing layer may be about 100% or more, for example, about 100% to about 200%. The cutting rate of the polishing layer may be 10 μm/hr or more, for example, about 10 μm/hr to about 80 μm/hr, for example, about 15 μm/hr to about 50 μm/hr. For example, when the hardness of the polishing surface; the tensile strength and elongation of the polishing layer; and the cutting rate of the polishing layer are simul-taneously within the abovementioned ranges, it may be evaluated as exhibiting physical and mechanical properties corresponding to the peak properties of the processing composition. In this case, the polishing pad including the polishing layer may be applied to a semiconductor device process to implement excellent polishing performance.

Hereinafter, a method for manufacturing the polishing pad will be described.

In another embodiment according to the present disclo-sure, a method for manufacturing a polishing pad compris-ing: preparing a pre-composition containing a prepolymer; mixing zinc (Zn) with the pre-composition; preparing a composition for manufacturing a polishing layer including the pre-composition, a foaming agent, and a curing agent; and manufacturing a polishing layer having a concentration of zinc (Zn) of about 0.5 ppm to about 40 ppm parts by weight based on the total weight, may be provided by curing the composition for manufacturing the polishing layer.

The preparing of the pre-composition may be a process of preparing a urethane-based prepolymer by reacting a diiso-cyanate compound and a polyol compound. The matters of the diisocyanate compound and the polyol compound are the same as those described above with respect to the polishing pad.

The pre-composition may have an isocyanate group con-tent (NCO %) of about 5% to about 11% by weight, for example, about 5% to about 10% by weight, for example, about 6% to about 9.5% by weight. In this case, it may be more advantageous to obtain a polishing layer having the abovementioned chemical bonding structure. The content of isocyanate groups in the pre-composition may be derived from terminal isocyanate groups of the urethane-based pre-polymer, unreacted isocyanate groups in the diisocyanate compound, etc.

The pre-composition may have a viscosity of about 100 cps to about 1,000 cps at about 80° C., for example, about 200 cps to about 800 cps, for example, about 200 cps to about 600 cps, for example, about 200 cps to about 600 cps, for example, from about 300 cps to about 600 cps.

The foaming agent may include a solid foaming agent or a gas foaming agent. The matters of the types of foaming agent, etc. are the same as those described above with respect to the polishing pad.

When the foaming agent includes a solid foaming agent, the preparing of the composition for manufacturing a polishing layer may include: preparing a first pre-composition by mixing the pre-composition and the solid foaming agent; and preparing a second pre-composition by mixing the first pre-composition and a curing agent.

The first pre-composition may have a viscosity of about 1,000 cps to about 2,000 cps at about 80° C., for example, about 1,000 cps to about 1,800 cps, for example, about 1,000 cps to about 1,600 cps, for example, about 1,500 cps to about 2,000 cps.

When the foaming agent includes a gas foaming agent, the preparing of the composition for manufacturing a polishing layer may include: preparing a third pre-composition including the pre-composition and the curing agent; and preparing a fourth pre-composition by adding the gas foaming agent to the third pre-composition.

In an embodiment, the third pre-composition may further contain a solid foaming agent.

The metal concentration of the polishing pad according to the embodiment may be adjusted to the above range by the following method.

The zinc (Zn) component described above may be added to the pre-composition in an appropriate amount to adjust the zinc (Zn) content of the polishing layer. That is, the zinc (Zn) component may be appropriately added to the pre-composition so that the zinc (Zn) content included in the polishing layer has the above range. Zinc (Zn) added to the pre-composition may be in the form of metal particles, metal ions, or metal salts.

In an embodiment, the method may include further mixing aluminum (Al) and iron (Fe) together with zinc (Zn) in the pre-composition. The added form of such a metal component may be a metal particle, a metal ion, or a metal salt. In addition, as for the concentration range in each of the polishing layers, all of the abovementioned contents for the polishing pad are equally integrated and applied.

In the polishing pad manufactured by the manufacturing method, the polishing layer as described above, may have a total oxidizing power index represented by Equation 3 of about 1.5 to about 10, for example, about 2 to about 9, for example, from about 2 to about 8, for example, about 3 to about 7, for example, about 2 to about 7.

In an embodiment, the process for manufacturing the polishing layer may include: preparing a mold preheated to a first temperature; injecting and curing the composition for manufacturing the polishing layer into the preheated mold; and post-curing the cured composition for manufacturing a polishing layer under a second temperature condition higher than the preheating temperature.

In an embodiment, a temperature difference between the first temperature and the second temperature may be about 10° C. to about 40° C., for example, about 10° C. to about 35° C., for example, about 15° C. to about 35° C.

In an embodiment, the first temperature may be about 60° C. to about 100° C., for example, about 65° C. to about 95° C., for example, about 70° C. to about 90° C.

In an embodiment, the second temperature may be about 100° C. to about 130° C., for example, about 100° C. to about 125° C., for example, about 100° C. to about 120° C.

The curing of the composition for manufacturing a polishing layer under the first temperature may be carried out for about 5 minutes to about 60 minutes, for example, about 5 minutes to about 40 minutes, for example, about 5 minutes to about 30 minutes, for example, about 5 minutes to about 25 minutes.

The post-curing of the composition for manufacturing a polishing layer cured under the first temperature under the second temperature may be carried out for about 5 hours to about 30 hours, for example, about 5 hours to about 25 hours, for example, about 10 hours to about 30 hours, for example, 10 hours to about 25 hours, for example, about 12 hours to about 24 hours, for example, about 15 hours to about 24 hours.

The method for manufacturing the polishing pad may include processing at least one surface of the polishing layer.

The processing of the at least one surface of the polishing layer may include at least one of the following steps: (1) forming a groove on at least one surface of the polishing layer; (2) performing line turning on at least one surface of the polishing layer; and (3) performing roughening on at least one surface of the polishing layer.

In the step (1), the groove may include at least one of concentric circular grooves spaced apart from the center of the polishing layer at a predetermined interval; and a radial groove continuously connected from the center of the polishing layer to an edge of the polishing layer.

In step (2), the line turning may be performed by using a cutting tool to cut the polishing layer by a predetermined thickness.

In step (3), the roughening may be performed by processing the surface of the polishing layer with a sanding roller.

The method for manufacturing the polishing pad may further include laminating a cushion layer on the back surface of the polishing surface of the polishing layer. The matters of the cushion layer are the same as those described above with respect to the polishing pad.

The polishing layer and the cushion layer may be laminated through a heat-fusion adhesive.

The heat-sealing adhesive is applied on the back surface of the polishing surface of the polishing layer, the heat-sealing adhesive is applied on the surface of the cushion layer to be in contact with the polishing layer, the polishing layer and the cushion layer are laminated so that the surfaces to which the respective heat-sealing adhesives are applied are in contact, and then the two layers may be fused using a pressure roller.

In another embodiment according to the present disclosure, provided is a method for manufacturing a semiconductor device, the method including: providing a polishing pad including a polishing layer; and arranging the polished surface of an object to be polished to be in contact with the polishing surface of the polishing layer and then polishing the object to be polished while rotating relative to each other, wherein the object to be polished includes a semiconductor substrate, the polishing layer includes zinc (Zn), and the concentration of zinc (Zn) is about 0.5 ppm to about 40 ppm parts by weight, based on the total weight of the polishing layer.

All of the matters of the structure and composition of the polishing layer, the processing composition of the polishing layer, and the concentrations of zinc (Zn), aluminum (Al) and iron (Fe) in the polishing layer may be integrated and applied in the same manner as those described above with respect to the polishing pad. By applying a polishing pad provided with a polishing layer having the abovementioned properties in the method for manufacturing the semiconductor device, the semiconductor device manufactured thereby may implement excellent functions derived from excellent polishing results of the semiconductor substrate.

In the method for manufacturing a semiconductor device, as described above, the total oxidizing power index of the polishing layer represented by Equation 3 may be about 1.5 to about 10, for example, about 2 to about 9, for example, about 2 to about 8, for example, about 3 to about 7, for example, about 2 to about 7. By applying the polishing layer having the total oxidizing power index in the above range to the method for manufacturing a semiconductor device, the surface to be polished of the semiconductor substrate may be polished with excellent polishing efficiency, and excellent polishing performance may be implemented in terms of polishing flatness and defect prevention.

FIG. 2 is a schematic view illustrating a method for manufacturing a semiconductor device according to an embodiment. Referring to FIG. 2, in the providing of the polishing pad including the polishing layer, the polishing pad 110 may be provided on the surface plate 120.

The object to be polished may include a semiconductor substrate, and the semiconductor substrate 130 may be disposed so that a surface to be polished thereof is in contact with a polishing surface of the polishing layer of the polishing pad 110. In this case, the surface to be polished of the semiconductor substrate 130 and the polished surface of the polishing layer may be in direct contact or in indirect contact with each other through a fluid slurry, etc.

In an embodiment, the method for manufacturing a semiconductor device may further include supplying a polishing slurry 150 to the polishing surface of the polishing layer of the polishing pad 110. For example, the polishing slurry 150 may be supplied onto the polishing surface through a supply nozzle 140.

A flow rate of the polishing slurry 150 sprayed through the supply nozzle 140 may be about 10 ml/min to about 1,000 ml/min, for example, about 10 ml/min to about 800 ml/min, for example, may be about 50 ml/min to about 500 ml/min, but is not limited thereto.

The polishing slurry 150 may include a silica slurry or a ceria slurry. When the polishing slurry includes silica particles or ceria particles as the polishing particles and the concentration of zinc Zn in the polishing layer is in the above range, the polishing particles may be detached from and attached to the polishing surface with an appropriate bonding force by an appropriate electrical interaction between the polishing slurry and the polishing surface of the polishing layer, which may be advantageous in securing an optimal polishing rate in terms of polishing efficiency and maximizing a defect prevention effect.

Specifically, when the polishing slurry includes silica particles or ceria particles as the polishing particles and the total oxidizing power index of the polishing layer according to Equation 3 is in the above range, electrical and chemical interactions between the polishing slurry and the polishing surface of the polishing layer may be further improved in terms of securing a desired level of polishing rate and securing a defect prevention effect.

The semiconductor substrate 130 may be pressed with a predetermined load to be in contact with the polishing surface in a state in which it is mounted on the polishing head 160. The load with which the surface to be polished of the semiconductor substrate 130 is pressed onto the polishing surface by the polishing head 160 may be selected according to a purpose, for example, in the range of about 0.01 psi to about 20 psi, and may be, for example, about 0.1 psi to about 15 psi, but is not limited thereto. When the polishing surface of the polishing layer and the surface to be polished of the semiconductor substrate are in contact with each other with the load described above, the polishing layer represents the hardness and the elongation represented by the peak characteristics described above, and the corresponding elasticity and contact area may be provided on the surface to be polished of the semiconductor substrate, which may be advantageous in implementing the polishing rate and the defect prevention effect of the semiconductor substrate at a desired level.

The semiconductor substrate 130 and the polishing pad 110 may be rotated relative to each other in a state in which the surface to be polished of the semiconductor substrate 130 and the polishing surface of the polishing pad 110 are in contact with each other. In this case, a rotation direction of the semiconductor substrate 130 and a rotation direction of the polishing pad 110 may be the same as or be opposite to each other. Rotation speeds of the semiconductor substrate 130 and the polishing pad 110 may be selected according to a purpose in the range of about 10 rpm to about 500 rpm, respectively, and may be, for example, about 30 rpm to about 200 rpm, but is not limited thereto. When the rotation speeds of the semiconductor substrate 130 and the polishing pad 110 are in the above range, respectively, the polishing layer represents the hardness and the elongation represented by the peak characteristics described above, and the corresponding elasticity and contact area may be provided on the surface to be polished of the semiconductor substrate, which may be advantageous in implementing the polishing rate and the defect prevention effect of the semiconductor substrate at the desired level.

In an embodiment, the method for manufacturing a semiconductor device may further include processing the polishing surface of the polishing pad 110 through a conditioner 170 simultaneously with the polishing of the semiconductor substrate 130 in order to maintain the polishing surface of the polishing pad 110 in a state suitable for polishing.

In an embodiment, in the method for manufacturing a semiconductor device, the semiconductor substrate may include a silicon oxide ($SiO_2$) layer, the surface to be polished may be a surface of the silicon oxide ($SiO_2$) layer, the number of surface defects on the surface to be polished after the polishing is completed may be less than five, and an average polishing rate of the silicon oxide ($SiO_2$) layer may be 1,500 Å/min to 2,500 Å/min, for example, equal to or more than about 1,500 Å/min and less than about 2,500 Å/min.

The method for manufacturing a semiconductor device may implement the above-described polishing rate and the defect prevention performance with respect to the semiconductor substrate having the silicon oxide ($SiO_2$) layer, which is an object to be polished, by applying the polishing pad including the polishing layer having the above-described characteristics.

Since the polishing pad includes the polishing layer corresponding to a metal concentration exhibited by the processing composition treated under a predetermined condition, the polishing surface of the polishing layer may exhibit appropriate hardness and electrical properties.

Accordingly, the polishing pad may exhibit a polishing rate and polishing flatness within a desired range in polishing the object to be polished. In addition, since the polishing pad includes the metal in an appropriate amount, an adsorption degree between the polishing pad and the slurry during a polishing process may be increased, and the polishing pad may have an improved polishing rate and improved polishing performance.

The method for manufacturing a semiconductor device using the polishing pad has high process efficiency in polishing the semiconductor substrate, which is the object to be polished. In addition, the method for manufacturing a semiconductor device according to an embodiment may allow the surface to be polished of the semiconductor substrate to have high polishing flatness and the lowest level of defects.

In addition, since the polishing pad according to an embodiment includes a metal component, electrical properties of the polishing surface may be appropriately adjusted. For example, since the polishing layer includes the metal component, surface-modified polishing particles may be easily bonded to the polishing surface by an electrostatic attractive force.

In particular, a surface potential of the polishing surface may be adjusted by the metal component so that the surface-modified polishing particles may be bonded to the polishing surface with an appropriate attractive force.

Since the metal component has the total oxidizing power index as described above, the surface-modified polishing particles may be bonded to the polishing surface by an appropriate electrostatic attractive force.

Accordingly, an appropriate amount of polishing particles may remain in the vicinity of the polishing surface with an appropriate bonding force. Accordingly, the semiconductor substrate such as a semiconductor wafer may be effectively polished by the polishing surface and the polishing particles.

Hereinafter, specific examples of the present disclosure will be provided. However, examples described below are merely for specifically illustrating or describing the present disclosure, and the present disclosure is not limited thereto.

EXAMPLE AND COMPARATIVE EXAMPLE

Example 1

TDI and $H_{12}MDI$ were mixed in relative weight ratios as shown in Table 1 respectively, based on total 100 parts by weight of the diisocyanate component. PTMG and DEG were mixed in relative weight ratios as shown in Table 1, respectively, based on total 100 parts by weight of the polyol component. A mixed raw material was prepared by mixing total 220 parts by weight of the polyol based on total 100 parts by weight of the diisocyanate. A pre-composition containing a urethane-based prepolymer was prepared by adding the mixed raw material into a four-neck flask and then allowing a reaction to be generated in the mixed raw material at 80° C. A content of isocyanate groups (NCO groups) in the pre-composition was adjusted to 9% by weight.

1.0 parts by weight of a solid foaming agent (available from Noryon Corp.), which is an expandable particle, was mixed with the pre-composition. In addition, zinc(II) acetate $(Zn(CH_3CO_2)_2)$, iron(II) acetate$(Fe(C_2H_3O_2)_2)$, and aluminium(III)triacetate $(Al(CH_3CO_2)_3)$ were added in parts by weight as shown in Table 1 based on the total 100 parts by weight of the pre-composition. In this case, zinc(II) acetate $(Zn(CH_3CO_2)_2)$, iron(II) acetate$(Fe(C_2H_3O_2)_2)$, and aluminium(III)triacetate $(Al(CH_3CO_2)_3)$ were diluted with acetone and added to the pre-composition.

4,4'-methylenebis(2-chloroaniline) (MOCA) as a curing agent was mixed with the pre-composition, and was mixed so that a molar ratio of $NH_2$ groups of the MOCA to NCO groups in the pre-composition was 0.95.

The pre-composition was injected into a mold having a width of 1,000 mm, a length of 1,000 mm, and a height of 3 mm and preheated to 90° C., and was injected at a discharge rate of 10 kg/min. Then, the pre-composition was subjected to a post-curing reaction under a temperature condition of 110° C. to manufacture a polishing layer.

Example 2 and Example 3

Polishing layers were manufactured in the same manner as in Example 1 except that amounts of added zinc(II) acetate $(Zn(CH_3CO_2)_2)$, iron(II) acetate$(Fe(C_2H_3O_2)_2)$, and aluminium(III)triacetate (Al(CH3CO$_2$)$_3$) are changed as shown in Table 2.

Comparative Example 1

TDI and $H_{12}MDI$ were mixed in relative weight ratios as shown in Table 1 respectively, based on total 100 parts by weight of the diisocyanate component. PTMG and DEG were mixed in relative weight ratios as shown in Table 1, respectively, based on total 100 parts by weight of the polyol component. A mixed raw material was prepared by mixing total 220 parts by weight of the polyol based on total 100 parts by weight of the diisocyanate. A pre-composition containing a urethane-based prepolymer was prepared by adding the mixed raw material into a four-neck flask and then allowing a reaction to be generated in the mixed raw material at 80° C. A content of isocyanate groups (NCO groups) in the pre-composition was adjusted to 9% by weight.

1.0 part by weight of a solid foaming agent (available from Noryon Corp.), which is an expandable particle, was mixed with the pre-composition. In addition, zinc(II) acetate $(Zn(CH_3CO_2)_2)$, iron(II) acetate$(Fe(C_2H_3I_2)_2)$, and aluminium(III)triacetate $(Al(CH_3CO_2)_3)$ were added in parts by weight as shown in Table 1 to total 100 parts by weight of the pre-composition. In this case, zinc(II) acetate $(Zn(CH_3CO_2)_2)$, iron(II) acetate$(Fe(C_2H_3O_2)_2)$, and aluminium(III)triacetate $(Al(CH_3CO_2)_3)$ were diluted with acetone and added to the pre-composition.

4,4'-methylenebis(2-chloroaniline) (MOCA) as a curing agent was mixed with the pre-composition, and was mixed so that a molar ratio of $NH_2$ groups of the MOCA to NCO groups in the pre-composition was 0.95.

The pre-composition was injected into a mold having a width of 1,000 mm, a length of 1,000 mm, and a height of 3 mm and preheated to 90° C., and was injected at a discharge rate of 10 kg/min. At the same time, a nitrogen $(N_2)$ gas was used as a gas foaming agent, and was injected at an injection rate of 1.0 L/min until injection of the pre-composition was completed. Then, the pre-composition was subjected to a post-curing reaction under a temperature condition of 110° C. to manufacture a polishing layer.

Comparative Example 2

Polishing layers were manufactured in the same manner as in Comparative Example 1 except that amounts of added zinc(II) acetate $(Zn(CH_3CO_2)_2)$, iron(II) acetate(Fe $(C_2H_3O_2)_2)$, and aluminium(III)triacetate $(Al(CH_3CO_2)_3)$ are changed as shown in Table 1.

Each of the polishing layers of Examples 1 to 3 and Comparative Examples 1 and 2 was processed to a thickness of 2 mm, and a process of processing a groove having a concentric shape was performed on a polishing surface of each of the polishing layers. Next, a cushion layer having a structure impregnated with a urethane-based resin and having a thickness of 1.1 mm was prepared on a polyester resin nonwoven fabric, a heat-fusion adhesive was applied to a back surface of the polishing surface and an attachment surface of the cushion layer, and the polishing surface and the cushion layer were laminated together using a pressure roller. Thus, a final polishing pad was manufactured.

Experimental Example 2: Evaluation of Physical Properties of Polishing Layer or Polishing Pad (1) Hardness Each of the polishing layers of Examples 1 to 3 and Comparative Examples 1 and 2 was processed to a thickness of 2 mm, and a width and a length of the polishing layer were then cut to a size of 5 cm×5 cm to prepare a sample. The sample was stored at a temperature of 25° C. for 12 hours, and Shore D hardness was then measured using a durometer.

(2) Tensile Strength

Each of the polishing layers of Examples 1 to 3 and Comparative Examples 1 and 2 was processed to a thickness of 2 mm, and a width and a length of the polishing layer

TABLE 1

| Division | Example 1 | Example 2 | Example 3 | Comp. Example 1 | Comp. Example 2 |
|---|---|---|---|---|---|
| Diisocyanate - TDI (wt %) | 96 | 96 | 96 | 96 | 96 |
| Diisocyanate - H$_{12}$MDI (wt %) | 4 | 4 | 4 | 4 | 4 |
| Diisocyanate Total (wt %) | 100 | 100 | 100 | 100 | 100 |
| Polyol - PTMG (Mw 1000) (wt %) | 97.5 | 97.5 | 97.5 | 97.5 | 97.5 |
| Polyol - DEG (Mw 106) (wt %) | 2.5 | 2.5 | 2.5 | 2.5 | 2.5 |
| Polyol Total (wt %) | 100 | 100 | 100 | 100 | 100 |
| Metal salt - Zinc(II) acetate (wt %) | 0.0009 | 0.0014 | 0.0007 | 0.0002 | 0.013 |
| Metal salt - Iron(II) acetate (wt %) | 0.0032 | 0.0046 | 0.0018 | 0.0003 | 0.0003 |
| Metal salt - Aluminium(III) triacetate (wt %) | 0.0026 | 0.0032 | 0.0025 | 0.002 | 0.001 |
| NCO group content of pre-composition (wt %) | 9 | 9 | 9 | 9 | 9 |
| Molar ratio (NH2 of curing agent/NCO) | 0.95 | 0.95 | 0.95 | 0.95 | 0.95 |
| Prepolymer preparation temperature (° C.) | 80 | 80 | 80 | 80 | 80 |
| Curing mold preheating temperature (° C.) | 90 | 90 | 90 | 90 | 90 |
| Post-curing temperature (° C.) | 110 | 110 | 110 | 110 | 110 |

<Evaluation>

Experimental Example 1: Measurement of Inductively Coupled Plasma Optical Emission Spectroscopy (ICP-OES) of Processing Composition For each polishing layer of Examples 1 to 3 and Comparative Examples 1 and 2, xg (in this case, less than 1 g) of a random portion within a depth of ½ of a total thickness from a polishing surface of the polishing layer was sampled. After the sampling, 1 ml of nitric acid and 3 ml of hydrochloric acid were added, and pretreatment was performed with a graphite block at 200° C. for 16 hours, and ICP-OES was then measured. In this case, Agilent 5100 was used as the ICP-OES, and measurement conditions were as follows.
<Measurement Conditions>
  RF power: 1.2 KW
  Nebulizer flow: 0.7 L/min
  Plasma flow: 12 L/min
  Aux flow: 1 L/min
  Read time: 5 s
Each of concentrations of zinc (Zn), aluminum (Al) and iron (Fe) in each polishing layer of Examples 1 to 3 and Comparative Examples 1 and 2 measured as described above was an average value of five measurements, was parts by weight based on the total weight of the polishing layer, and was as shown in Table 2.

In addition, the value of Equation 3 was derived as a total oxidizing power index of each polishing layer of Examples 1 to 3 and Comparative Examples 1 and 2, which was shown in Table 2.

were then cut to a size of 4 cm×1 cm to prepare a sample. The highest strength value of the sample just before fracture at a speed of 500 mm/min was measured using a universal testing machine (UTM).

(3) Elongation

Each of the polishing layers of Examples 1 to 3 and Comparative Examples 1 and 2 was processed to a thickness of 2 mm, and a width and a length of the polishing layer were then cut to a size of 4 cm×1 cm to prepare a sample. A maximum strain length of the sample just before fracture at a speed of 500 mm/min was measured using a universal testing machine (UTM), and a ratio of the maximum strain length to an initial length was then expressed as a percentage (%).

(4) Cutting Rate

Each polishing pad manufactured as described above using each of the polishing layers of Examples 1 to 3 and Comparative Examples 1 to 2 was pre-conditioned with deionized water for 10 minutes, and then conditioned while spraying deionized water for 1 hour. A thickness changed in the conditioning process was measured, and a change amount (μm/hr) in the thickness was calculated as a cutting rate of the polishing pad. An equipment used for conditioning was AP-300HM available from CTS Corp., a conditioning pressure was 6 lbf, a rotation speed was 100 to 110 rpm, and a disk used for conditioning was CI-45 available from Saesol Corp.

Experimental Example 3: Evaluation of Polishing Performance

Each polishing pad to which each of the polishing layers of Examples 1 to 3 and Comparative Examples 1 to 2 is applied was manufactured, and polishing performance of each polishing pad was then evaluated as follows.

Silicon oxide ($SiO_2$) was deposited on a silicon wafer having a diameter of 300 mm by a chemical vapor deposition (CVD) process. The polishing pad was attached to CMP equipment, and a surface of a silicon oxide layer of the silicon wafer was installed to face a polishing surface of the polishing pad. Silicon wafer is pressed onto the polishing surface with a load of 4.0 psi while supplying a calcined ceria slurry onto the polishing pad at a speed of 250 mL/min, and rotation speeds of the polishing pad and the silicon wafer were set to 150 rpm to polish the silicon oxide layer for 60 seconds. After the silicon oxide layer was polished, the silicon wafer was detached from a carrier, mounted on a spin dryer, cleaned with purified water (DIW), and then dried with nitrogen for 15 seconds.

(1) Average Polishing Rate

With respect to the dried silicon wafer, a change in a thickness of the silicon oxide layer before and after being polished was measured using an optical interference thickness measuring device (SI-F80R available from Kyence Corp). Then, a polishing rate was calculated using the following equation. As such, the polishing rate was measured a total of five times, and a number average value was obtained, which was set as an average polishing rate.

Polishing rate (Å/min)=Polishing thickness (Å) of
silicon wafer/Polishing time (min)

(2) Defect

Polishing was performed in the same manner as the polishing rate measurement method, and the number of defects such as scratches was derived by observing a polished surface of an object to be polished with the naked eyes. Specifically, after the polishing was performed, the silicon wafer was moved to a cleaner, and was cleaned for 10 seconds using each of 1% of hydrogen fluoride (HF) and purified water (DIW); and 1% of nitric acid ($H_2NO_3$) and purified water (DIW). Thereafter, the silicon wafer was moved to a spin dryer, cleaned with purified water (DIW), and dried with nitrogen ($N_2$) for 15 seconds. A change in defects of the dried silicon wafer before and after being polished was observed with the naked eyes using a defect measuring device (XP+ available from Tenkor Corp.).

Results of Experimental Examples 1 to 3 are as shown in Table 2.

Referring to Table 2, it can be seen that each of the polishing layers of Examples 1 to 3 is a polishing layer in which a concentration of zinc (Zn) in a processing composition treated under predetermined conditions is 0.5 ppm to 40 ppm based on the total weight of the polishing layer, a concentration of iron (Fe) in the processing composition is 1 ppm to 50 ppm based on the total weight of the polishing layer, and a concentration of aluminum (Al) in the processing composition is 2 ppm to 50 ppm based on the total weight of the polishing layer, and with a pad to which such a polishing layer is applied, a polishing result of the semiconductor substrate is very excellent based on corresponding properties such as hardness, tensile strength, elongation and a cutting rate.

In contrast, it can be seen that in the polishing layers of Comparative Examples 1 and 2, the sum of concentrations of iron, aluminum, and zinc (Zn) is out of a range of 2 ppm to 40 ppm based on the total weight of the polishing layer, and a total oxidizing power index is out of the range of 1.5 to 10, such that hardness of the polishing layers is lower or higher than that of the polishing layers of Examples 1 to 3.

More specifically, it can be seen that in a case of Comparative Example 1, a total oxidizing power index is less than 1.5, and thus, a polarity degree is low, and a electrostatic repulsion force with a surface to be polished and a slurry is reduced, and thus, a polishing rate is lowered. On the other hand, it can be seen that in a case of Comparative Example 2, a polishing rate is high, but an electrostatic attractive force between a polishing pad and a surface to be polished is strong, such that defects of the surface to be polished are increased. Therefore, it may be seen that the polishing pads of Comparative Examples 1 and 2 did not provide a desired level of polishing performance, and thus, were inferior to the polishing pads of Examples 1 to 3 in terms of average polishing rate and defects.

The invention claimed is:

1. A polishing pad comprising:

a polishing layer, wherein the polishing layer includes zinc (Zn), and a concentration of the zinc (Zn) is 0.5 ppm to 40 ppm parts by weight based on a total weight of the polishing layer,

TABLE 2

| Division | Example 1 | Example2 | Example3 | Comp. Example 1 | Comp. Example 2 |
|---|---|---|---|---|---|
| Polishing layer - Density | 0.8 | 0.8 | 0.8 | 0.8 | 0.8 |
| Polishing layer - (Shore D) | 56.8 | 57.4 | 58.4 | 52 | 60.5 |
| Polishing layer - Tensile Strength (N/mm$^2$) | 22.1 | 22.3 | 21.4 | 21.5 | 20.2 |
| Polishing layer - Elongation (%) | 106.5 | 103.7 | 94.4 | 118 | 98.4 |
| Sub-pad - Type | Nonwoven fabric | Nonwoven fabric | Nonwoven fabric | Nonwoven fabric | Nonwoven fabric |
| Sub-pad - Thickness (mm) | 1.1 | 1.1 | 1.1 | 1.1 | 1.1 |
| Sub-pad - Hardness (C) | 70 | 70 | 70 | 70 | 70 |
| Pad-Thickness (mm) | 3.32 | 3.32 | 3.32 | 3.32 | 3.32 |
| Pad-Compression rate (%) | 1.05 | 1.05 | 1.05 | 1.05 | 1.05 |
| Average polishing rate (Å/min) | 2342 | 2335 | 2412 | 1985 | 3302 |
| Cutting rate (μm/hr) | 19.2 | 19.1 | 19.4 | 20.1 | 21.1 |
| Number of defects (ea) | 1 | 1 | 0.5 | 4 | 252 |
| polishing layer - Con. Al (ppm) | 3.44 | 4.2 | 3.26 | 2.75 | 1.3 |
| polishing layer - Con. Fe (ppm) | 7.97 | 11.56 | 4.55 | 0.62 | 0.94 |
| polishing layer - Con. Zn (ppm) | 2.95 | 4.49 | 2.56 | 0.38 | 43.36 |
| Con. Al + Con. Fe + Con. Zn (ppm) | 14.36 | 20.25 | 10.37 | 3.75 | 45.6 |
| Oxidizing power index | 3.15 | 6.61 | 3.48 | 1.45 | 12.38 | wherein the polishing layer has a total oxidizing power index of 1.5 to 10 represented by the following Equation 3:

$$\text{Total oxidizing power index} = (\text{Con.}_{Al} \times \text{Oxi.}_{Al}) + (\text{Con.}_{Zn} \times \text{Oxi.}_{Zn}) + (\text{Con.}_{Al} \times \text{Oxi.}_{Al}) \qquad \text{[Equation 3]}$$

wherein $\text{Con.}_{Al}$ is a concentration value in ppm of the weight of aluminum based on the total weight of the polishing layer, $\text{Con.}_{Zn}$ is the concentration of zinc (Zn), $\text{Con.}_{Fe}$ is a concentration value in ppm of the weight of iron (Fe) based on the total weight of the polishing layer, the $\text{Oxi.}_{Al}$ is an ionization index of the aluminum (Al), and is a value obtained by dividing the reciprocal of the primary ionization energy of the aluminum (Al) by the sum of the reciprocal of the primary ionization energy of the aluminum (Al), the reciprocal of the primary ionization energy of the zinc (Zn), and the reciprocal of the primary ionization energy of the iron (Fe), the $\text{Oxi.}_{Zn}$ is an ionization index of the zinc (Zn), and is a value obtained by dividing the reciprocal of the primary ionization energy of the zinc (Zn) by the sum of the reciprocal of the primary ionization energy of aluminum (Al), the reciprocal of the primary ionization energy of the zinc (Zn), and the reciprocal of the primary ionization energy of the iron (Fe), and the $\text{Oxi.}_{Fe}$ is an ionization index of the iron (Fe), and is a value obtained by dividing the reciprocal of the primary ionization energy of the iron (Fe) by the sum of the reciprocal of the primary ionization energy of the aluminum (Al), the reciprocal of the primary ionization energy of the zinc (Zn), and the reciprocal of the primary ionization energy of the iron (Fe).

2. The polishing pad of claim 1, wherein the polishing layer further includes iron (Fe), and a concentration of the iron (Fe) is 1 ppm to 50 ppm parts by weight based on the total weight of the polishing layer.

3. The polishing pad of claim 1, wherein the polishing layer further includes aluminum (Al), and a concentration of the aluminum (Al) is 2 ppm to 50 ppm parts by weight based on the total weight of the polishing layer.

4. The polishing pad of claim 1, wherein a metal included in the polishing layer has an oxidation number of +1 to +3.

5. The polishing pad of claim 1, wherein a total sum of the concentrations of the iron (Fe), the zinc (Zn) and the aluminum (Al) included in the polishing layer is 5 ppm to 40 ppm parts by weight based on the total weight of the polishing layer.

6. The polishing pad of claim 1, wherein a concentration of the zinc (Zn) included in the polishing layer in a region from a polishing surface to a depth of ½ of a total thickness is 0.5 ppm to 40 ppm parts by weight based on the total weight of the polishing layer.

7. The polishing pad of claim 1, wherein a concentration of the iron (Fe) included in the polishing layer in a region from a polishing surface to a depth of ½ of a total thickness is 1 ppm to 40 ppm parts by weight based on the total weight of the polishing layer.

8. The polishing pad of claim 1, wherein a concentration of the aluminum (Al) included in the polishing layer in a region from a polishing surface to a depth of ½ of a total thickness is 2 ppm to 50 ppm parts by weight based on the total weight of the polishing layer.

9. The polishing pad of claim 1, wherein a sum of the concentrations of the iron (Fe), the zinc (Zn), and the aluminum (Al) from a polishing surface of the polishing layer to a depth of ½ of a total thickness is 5 ppm to 40 ppm parts by weight based on the total weight of the polishing layer.

10. The polishing pad of claim 1, wherein the polishing layer has a hardness of 53 to 60 Shore D, and the polishing layer has an elongation of 80 to 110%.

* * * * *